(12) United States Patent
Newby

(10) Patent No.: US 6,999,318 B2
(45) Date of Patent: Feb. 14, 2006

(54) HEATSINKING ELECTRONIC DEVICES

(75) Inventor: Theodore A. Newby, Glendale, AZ (US)

(73) Assignee: Honeywell International Inc., Morristown, NJ (US)

( * ) Notice: Subject to any disclaimer, the term of this patent is extended or adjusted under 35 U.S.C. 154(b) by 153 days.

(21) Appl. No.: 10/629,374

(22) Filed: Jul. 28, 2003

(65) Prior Publication Data

US 2005/0024834 A1 Feb. 3, 2005

(51) Int. Cl.
*H05K 7/20* (2006.01)

(52) U.S. Cl. .................... 361/719; 361/704; 257/99; 257/706; 362/294; 362/373

(58) Field of Classification Search ............. 361/704, 361/705, 712, 717–719; 257/678, 291–293, 257/99, 103, 75, 88, 725, 728, 431–432, 257/433–434; 362/227, 294, 373, 555, 800, 362/487, 543, 545, 382, 396
See application file for complete search history.

(56) References Cited

U.S. PATENT DOCUMENTS

| | | | |
|---|---|---|---|
| 5,698,866 A | * | 12/1997 | Doiron et al. ................ 257/99 |
| 5,857,767 A | * | 1/1999 | Hochstein .................. 362/294 |
| 6,045,240 A | * | 4/2000 | Hochstein .................. 362/294 |
| 6,375,340 B1 | * | 4/2002 | Biebl et al. ................. 362/294 |
| 6,428,189 B1 | * | 8/2002 | Hochstein .................. 362/373 |
| 6,517,218 B1 | * | 2/2003 | Hochstein .................. 362/294 |
| 6,582,100 B1 | * | 6/2003 | Hochstein et al. .......... 362/294 |
| 6,614,103 B1 | * | 9/2003 | Durocher et al. ........... 257/678 |
| 6,864,513 B1 | * | 3/2005 | Lin et al. ...................... 257/99 |

FOREIGN PATENT DOCUMENTS

| | | |
|---|---|---|
| EP | 1139019 A | 10/2001 |
| JP | 403078247 A * | 4/1991 |
| WO | WO96/41507 A | 12/1996 |

* cited by examiner

*Primary Examiner*—Michael Datskovskiy
(74) *Attorney, Agent, or Firm*—Andrew A. Abeyta

(57) ABSTRACT

Method and apparatus are provided for thermally coupling one or more electronic devices to a heatsink. The apparatus comprises a heatsink having a substantially planar upper surface, a wiring board (PWB) with a through-hole for receiving the device such that a principal face thereof is in thermal contact with the heatsink, its electrical leads are captured between at least a portion of the wiring board and the heatsink, and a top of the device protrudes through the PWB. The method comprises placing the device in the through-hole with its base exposed on and protruding from the underside of the PWB, attaching its electrical leads to contacts on the wiring board and pressing the PWB toward the heatsink with the leads captured there between. An electrically insulating thermally conducting layer is desirably placed between the wiring board and the heatsink.

18 Claims, 4 Drawing Sheets

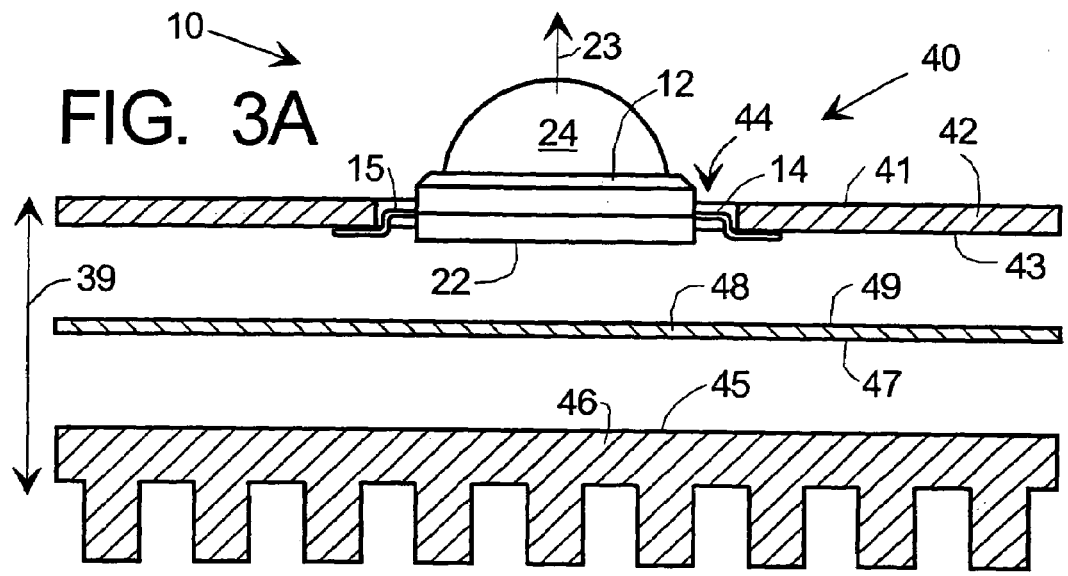
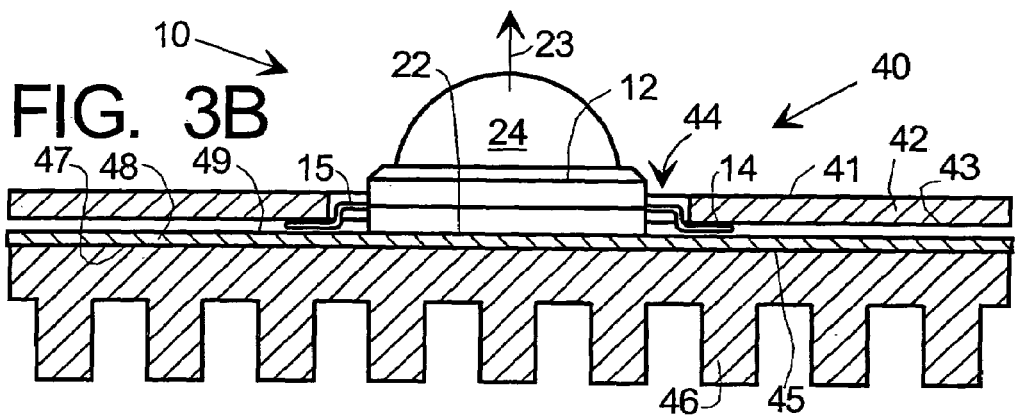

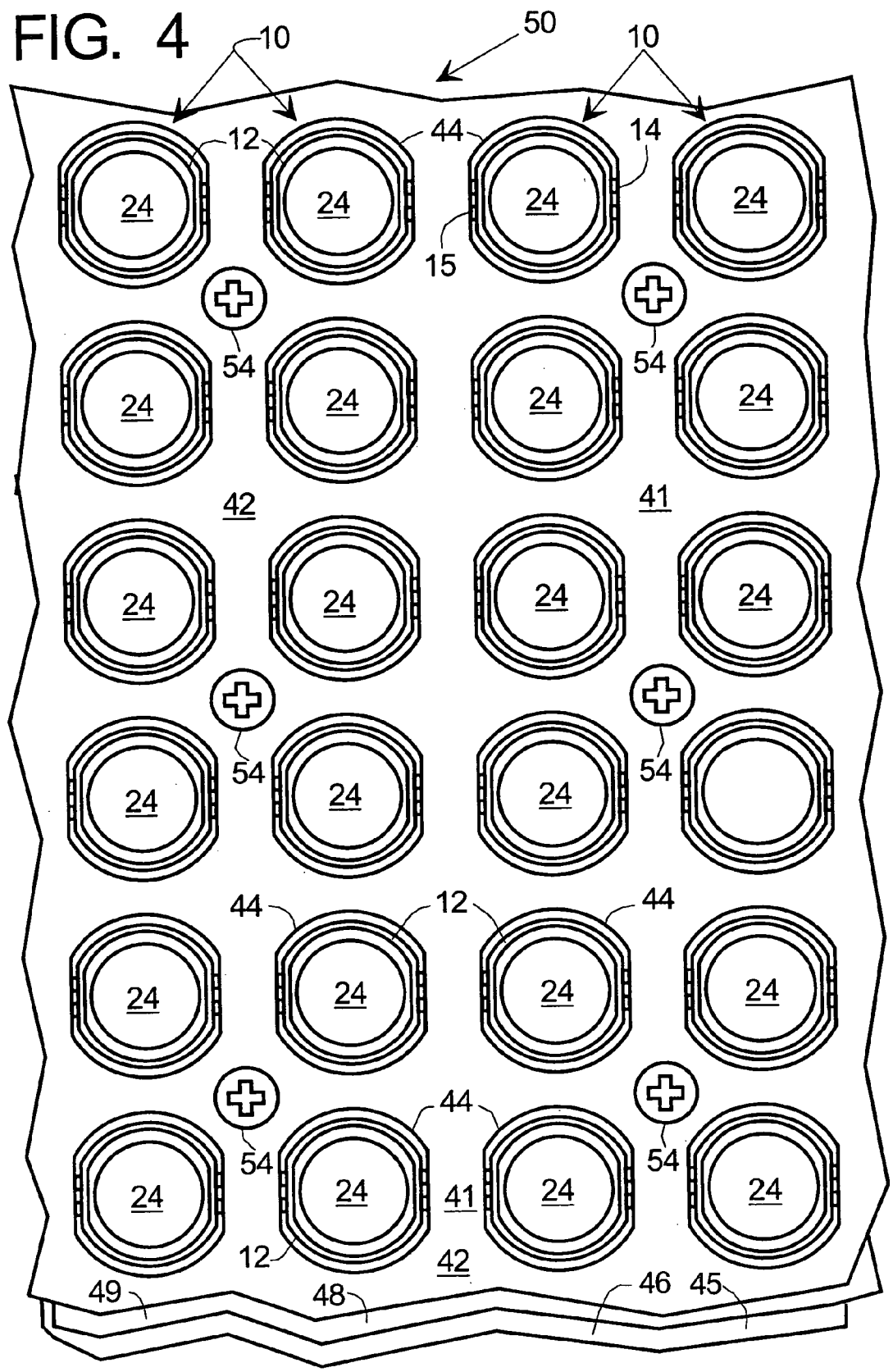

HEATSINKING ELECTRONIC DEVICES

TECHNICAL FIELD

The present invention generally relates to improved heatsinking of electronic devices, and more particularly to heatsinking of relatively high power dissipation electronic devices having surface mount package configurations or equivalent.

BACKGROUND

Many modern day electronic devices are often enclosed in what are referred to as surface mount packages, that is, packages generally intended to sit on or above a wiring board and having leads formed in such a way as to readily attach (e.g., by soldering) to contact regions on the surface of the wiring board, as opposed to being inserted into contact holes passing through the wiring board. By way of illustration and not intended to be limiting, FIG. 1A is a top view and FIG. 1B is a side view of high power light emitting diode (LED) 10 having surface mount package 12. LED 10 in package 12 has electrical leads or contacts 14–17 protruding laterally from sides 18–19 of LED package 12. Leads 14–15 of package 12 are formed downward and outward so that foot portions 20, 21 of leads 14, 15 are approximately parallel to base 22 of package 12. LED 10 conveniently emits light through lens 24 opposite to package base 22, but this is not essential. Persons of skill in the art will understand that although device 10 is identified herein as an LED, this is merely for convenience of description and not intended to be limiting. The problem described herein and the present invention apply to any type of electronic device having a generally surface mount lead configuration and substantially planar lower surface for contacting a heat sink.

With most surface mount packages the heat being generated by the internal electronic circuit or semiconductor chip is primarily extracted or dissipated through base 22 of package 12. Thus, it is important, especially with high power dissipation devices, that good thermal contact is made to base 22 of package 12. FIGS. 2A–B are partial cross-sectional views illustrating prior art arrangements for providing thermal contact to base 22 of package 12. In FIG. 2A, device 10 is surface mounted on wiring board 26 by, for example, soldering leads 14, 15 to electrical contact regions (not shown) on upper surface 25 of wiring board 26. Wiring board 26 is often referred to as a "printed circuit board" (PCB) or "printed wiring board" (PWB). For convenience, the abbreviation PWB is used herein. PWBs generally have a core of insulating material (e.g., plastic impregnated fiberglass) on which copper (or other highly conductive metal) foil "wires" have been formed, including the contact regions on surface 25 to which leads 14, 15 of device 10 are to be soldered. PWBs are well known in the art. For simplicity, the conductive metal leads and contact regions present on PWB 26 have been omitted in FIGS. 2A–B. However persons of skill in the art will understand that PWB 26 in FIGS. 2A–B (and PWB 42 in FIGS. 3A–B, 4) have such conductive leads and contacts in locations appropriate to the circuit being implemented and the location of the devices being placed thereon.

The insulating core of the PWB is generally a poor thermal conductor. For this reason, even though lower surface 27 of PWB 26 is in contact with upper surface 32 of heatsink 30, PWB 26 does not contribute greatly to heat disipation from device 10. Accordingly, it has been common in the prior art to provide metal insert regions 28 that act as thermal vias, underlying base 22 of package 12. These metal inserts or thermal vias (the terms are used interchangeably herein) reduce the thermal impedance between package base 22 and heatsink 30. It is common in the prior art to use a thermally conductive grease or adhesive between base 22 and thermal vias 28 and also between thermal vias 28 and heatsink 32. An adhesive provides the best heat conduction but prevents or greatly hinders replacement of defective LEDs and adds to the manufacturing cost of the assembly of FIG. 2A. Metal insert regions 28 are often formed by plating but other methods can also be used. A further disadvantage of the arrangement of FIG. 2A is that forming metal insert regions 28 is costly.

FIG. 2B is a cross-sectional view similar to FIG. 2A but showing a different arrangement used in the prior art for providing heat sinking of device 10. In FIG. 2B, heatsink 30' is provided with pillar 33 which makes direct contact at surface 32' with base 22 of device 10. While this arrangement generally provides good thermal contact to device 10, heatsink 30' must be machine to have pillar(s) 33 in the correct location(s) to match hole(s) 29 in the location(s) of device(s) 10. This can be very costly since, in general, standard heatsinks cannot be used and must be custom machined for each PWB configuration. This is a significant disadvantage, especially where the PWB contains a large number of high power dissipation devices.

Accordingly, it is desirable to provide an improved and less costly means and method for heatsinking surface mount electronic devices. In addition, it is desirable to provide an arrangement and method wherein the devices are held in compression both with respect to their leads and the heat dissipation surface of the device package. Still further, it is desirable to provide a means and method for improved heat dissipation that is especially well adapted to PWBs having an array of high dissipation electronic devices. Furthermore, other desirable features and characteristics of the present invention will become apparent from the subsequent detailed description and the appended claims, taken in conjunction with the accompanying drawings and the foregoing technical field and background.

BRIEF SUMMARY

An apparatus is provided for thermally coupling one or more electronic devices to a heatsink. The apparatus comprises: an electronic device having a top, a bottom and electrical leads; a heatsink; and a wiring board with a through-hole for receiving the device such that its bottom is in thermal contact with the heatsink and its top protrudes through the PWB and its leads are captured between at least a portion of the wiring board and the heatsink.

A method is provided for thermally coupling one or more electronic devices to a heatsink. The method comprises placing the device in the through-hole in the PWB with its base surface protruding from the underside of the PWB, attaching its electical leads to contacts on the PWB and pressing the PWB toward the heatsink with the device electrical leads captured there between. An electrically insulating thermally conducting layer is desirably placed between the wiring board and the heatsink.

BRIEF DESCRIPTION OF THE DRAWINGS

The present invention will hereinafter be described in conjunction with the following drawing figures, wherein like numerals denote like elements, and FIG. 1A is a top view and FIG. 1B is a side view of a present day, high power dissipation electronic device intended for surface mounting on a wiring board or the like;

FIGS. 3A–B are partial cross-sectional views of the device of FIGS. 1A–B mounted on a wiring board and associated heatsink according to the present invention, wherein FIG. 3A shows a partially assembled view and FIG. 3B shows a fully assembled view;

FIG. 4 is a top view of an array of electronic devices mounted on a PWB and heatsink, according to the present invention.

DETAILED DESCRIPTION

Figure 1A:
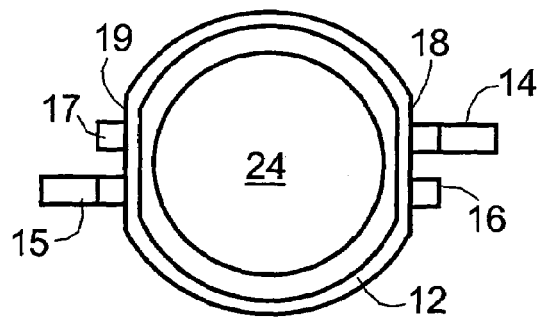
Figure 1B:
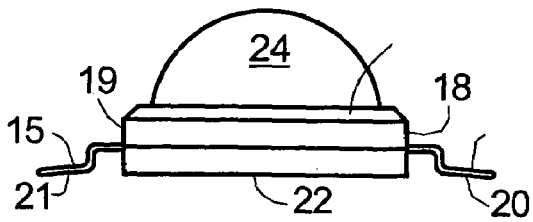

FIGS. 3A–B are partial cross-sectional views of arrangement 40 for mounting device 10 of FIGS. 1A–B on wiring board 42 and associated heatsink 46, according to the present invention, wherein FIG. 3A shows a partially assembled view (exploded in the direction of arrow 39) and FIG. 3B shows a fully assembled view. Arrangement 40 has device 10 of FIGS. 1A–B with leads 14–15, lens 24, package body 12 and lower heat dissipating surface 22. Leads 14–15 are attached (e.g., by soldering) to appropriate contact regions (not shown) on lower surface or underside 43 of PWB 42. PWB 42 has through-hole 44 for receiving body 12 of device 10. Lens 24 faces away from upper surface 41 of PWB 42 and from heatsink 46. Leads 14–15 are desirably formed such that when device body 12 is installed in through-hole 44 and leads 14–15 are attached to electrical contacts (not shown) provided on lower surface 43 of PWB 42, and that base 22 of package body 12 extends slightly below lower surface 43 of PWB 42.

Figure 2A:
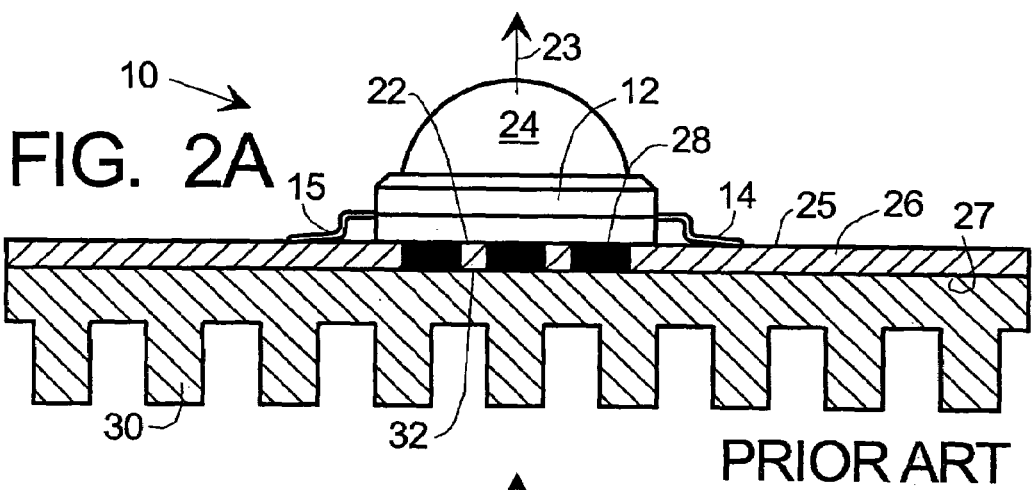
FIGS. 2A–B are partial cross-sectional views showing the device of FIGS 1A–B mounted on a wiring board and associated heatsink, according to the prior art.
Figure 2B:
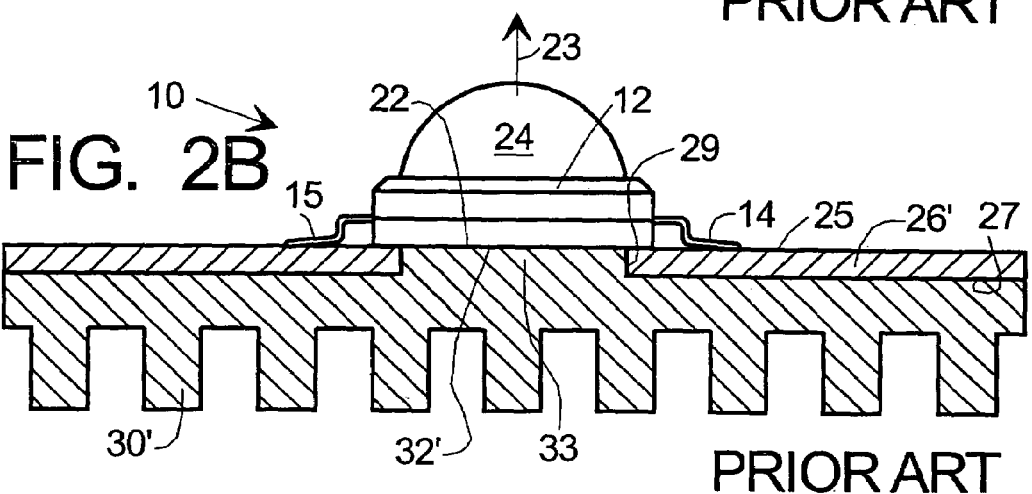

Thermally conducting layer 48 is preferably but not essentially provided between PWB 42 and lower surface 22 of package 12, and upper surface 45 of heatsink 46. This is to avoid air bubbles or other interface anomalies that might increase the interfacial thermal impedance between lower surface 22 of package 12 and upper surface 45 of heatsink 46. Thermally conductive layer 48 should be resilient (e.g., thermally conductive rubber) and as thin as possible consistent with any requirement that it also be electrically insulating. When layer 48 is omitted, any exposed leads on lower surface 43 of PWB 42 need to be covered with an electrical insulating layer or, alternatively, upper surface 45 of heatsink 46 should have an insulating layer thereon. For aluminum heatsinks, an aluminum oxide layer or oxide containing paints are examples of useful thermally conductive but electrically insulating layers. Heatsink 46 is conveniently made of extruded aluminum but other thermally conductive materials may also be used. Because upper surface 45 need not have any special machining or other features, low cost standard heatsinks may be used. This is a significant advantage. Gap Pad A3000 manufactured by the Berquist Company, Chanhassen, Minn., is an example of a suitable material for thermally conductive layer 48. In a preferred embodiment of the present invention, layer 48 of this material having a thickness of 0.020 inches (0.5 mm) was suitable, but thicker or thinner layers can also be used depending upon the choice of electronic device(s) and the heatsink. The assembly of PWD 42, layer 48 and heatsink 46 is conveniently held together with screws (e.g., see FIG. 4), rivets, clamps or equivalent so that leads 14–15 and lower surface 22 of device body surface 12 are firmly pressed against layer 48 and underlying heatsink 46. It will be noted that with the arrangement of the present invention, leads 14–15 are clamped between PWB 42 and layer 48 and underlying heatsink 46. This is a significant advantage because: (1) it produces a much more rugged structure, and (2) it improves the thermal coupling of device 20 to heatsink 46. Persons of skill in the art will appreciate that leads 14–15 are important thermal pathways through which heat may be removed from device 10 and that the present arrangement provides much better thermal coupling of leads 14–15 to heatsink 46 than the prior art arrangement of FIGS. 2A–B.

FIG. 4 is a top view of array 50 of electronic devices 10 mounted on PWB 42, according to the present invention. Array 50 is constructed as illustrated in cross-section in FIGS. 3A–B. Screws 54 extend through PWB 42 and layer 48 into heatsink 46. When tightened, screws 54 firmly couple PWB 42 to heatsink 46, trapping leads 14–15 therebetween and forcing lower package surface 22 against thermal layer 48 in contact with heatsink surface 45 (see FIGS. 3A–B). In array 50, it is assumed for convenience of explanation that all of devices 10 are identical but this is not essential. Array 50 illustrates the advantages of the present invention when a dense array of high power, high dissipation devices must be arranged in close physical proximity, while still providing efficient heat removal therefrom. The array illustrated in FIG. 4 assembled as indicated in FIGS. 3A–B (or FIGS. 5A–B), is particularly easy to assemble using standard elements. Other than the PWB, which is always a custom part in any case, device 10, layer 48 and heatsink 46 can all be off-the-shelf standard parts. Only the holes for clamp screws 54 (or rivets or equivalent) need be added to heatsink 46 but this is not essential. For example, by using external clamps no additional holes need be formed in heatsink 46. Being able to use a standard heatsink with little or no modification substantially reduces the cost of producing array 50, while at the same time providing equivalent or better thermal dissipation compared to the prior art.

A further advantage of the present invention is that devices 10 are easily replaceable. In some prior art arrangements, in order to obtain adequate thermal conduction to the heatsink it has been common to attach devices 10 to the PWB and/or the PWB to the heatsink using thermally conductive glue. The glue makes disassembly difficult or impossible. With the present, arrangement such glue is not needed and the array may be easily disassembled to unsolder and replace any or all of devices 10. This is a significant advantage.

Figure 5A:
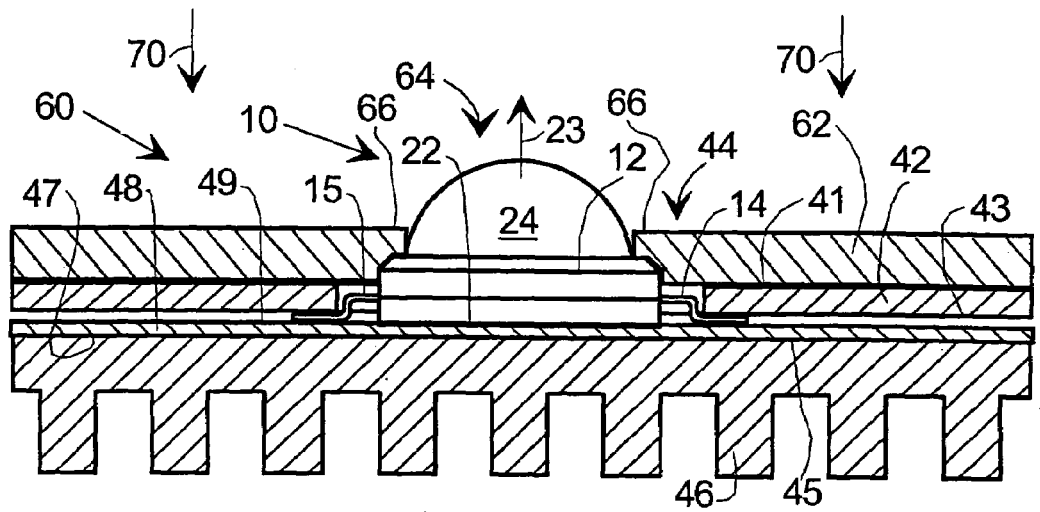
FIGS. 5A–B are partial cross-sectional views similar to FIG. 3B but according to still further embodiments of the present invention.
Figure 5B:
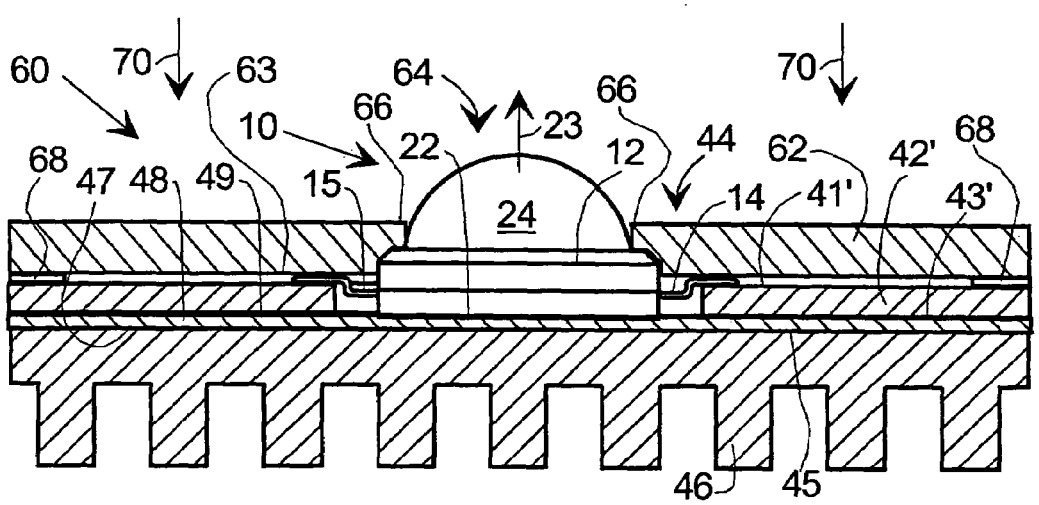

FIGS. 5A–B are partial cross-sectional views similar to FIG. 3B but according to still further embodiments of the present invention. Like reference numbers are used for like elements. In FIG. 5A, assembly 60 has the same structure as assembly 40 of FIG. 3B but with overlay member 62 added above PWB 42. Overlay member 62 has hole 64 therein through which the upper portion, e.g., lens 24, of device 10 protrudes or is exposed. Hole 64 is smaller than hole 44 and of a size to permit lens 24 (or other portion of device 10) to be exposed in the direction of arrow 23, but too small for all of package body 12 to pass through. Overlay member 62 has shoulder region 66 which contacts package 12 of device 10 so that, when overlay member 62 is clamped against heatsink 46 or thermal layer 48 (e.g, using screws 54 of FIG. 4 or equivalent), it presses down on package body 12 thereby forcing base 22 into intimate contact with heatsink 46 or thermal layer 48. Leads 14–15 need not be used to apply this compressive force to device 10. Overlay member 62 can be made of any convenient material and need only have hole(s) 64 wherever device(s) 10 are to be located and some means for being clamped with respect to heatsink 46, as for example, using screws equivalent to screws 54 or some other means. Overlay member 64 is shown here as being a separate layer from PWB 42 but that is merely for purposes of explanation and not intended to be limiting. PWB 42 and overlay member 62 can be combined. FIG. 5B is similar to FIG. 5A except that with assembly 60' leads 14, 15 of device 10 are modified to attach to contact pads (not shown) on upper surface 41' of PWB 42', or, equivalently, on lower surface 63 of overlay member 62. Either arrangement is useful. Shims 68 can optionally be included to more evenly distribute the clamping force being applied to overlay member 62 in the direction of arrows 70. It will be noted that in FIGS. 5A–B package body 12 is in compression with respect to heatsink 46 and leads 14–15 need not be stressed, but are still compressed against the contact areas to which they attach, that is, captured between PWB 42 or overlay member 62 and heatsink 46. This is desirable because it provides a more rugged overall structure with improved thermal properties. In the claims that follow, reference to a "wiring board" are intended to include either PWB 42, 42' alone or the combination of PWB 42, 42' and overlay member 62, and equivalent structures.

The foregoing detailed description is merely exemplary in nature and is not intended to limit the invention or the application and uses of the invention. In particular, while device 10 has been illustrated as being a surface mount type LED this is merely for convenience of explanation and not intended to be limiting. Device 10 can be any type of electronic component that dissipates significant amounts of thermal energy and must be closely coupled to a heat sink and which has leads suitable for surface mounting. In addition, while the above description illustrates the present invention for a surface mount device whose upper surface (e.g., the lens) must face away from the PWB, this is not intended to be limiting. Persons of skill in the art will understand based on the description herein that for other types of devices where a particular package surface need not be exposed, they can be installed using the teachings of the present invention with either face up (away from the heatsink) or down (toward the heatsink). However it is desirable that the package surface that has the lowest internal impedance to the active, heat generating, chip be the surface facing toward the heatsink. Furthermore, there is no intention to be bound by any expressed or implied theory presented in the preceding technical field, background, brief summary or the following detailed description.

To summarize, the present invention has the following advantages: (A) devices 10 are easily replaceable; (B) compressive forces are applied to the tips of leads 14–15 thereby reducing the stress on the (e.g., solder) joints between leads 14–15 and the corresponding contact regions on the PWB; (C) leads 14–15 are in better thermal contact with heatsink 46 thereby improving the overall heat dissipation (e.g., providing lower thermal impedance between device 10 and heatsink 46); (D) the heatsink design and fabrication is simplified thereby lowering its cost; and (E) the number of thermal interfaces between device 10 and heatsink 46 is reduced, thereby improving the thermal coupling and reducing the thermal impedance between device 10 and heatsink 46. These are important advantages collectively realized by the present invention so that it provides the same or better thermal dissipation at lower cost.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An electrical optical array comprising:
   a wiring board having a first plurality of openings therethrough and having first and second substantially opposite surfaces;
   a second plurality of contact pads disposed on said wiring board;
   a third plurality of LEDs each restrainably coupled within one of said first plurality of openings and having a third surface extending beyond said first surface and having a fourth surface exposed through said second surface;
   at least one electrical lead extending from each of said third plurality of LEDs to at least one of said second plurality of contact pads; and
   a heat sink thermally coupled to said third surface of each of said third plurality of LEDs and the at least one electrical lead.

2. The array of claim 1 further comprising a thermally conductive layer between the heatsink and said third surface of at least some of said third plurality of LEDs.

3. The array of claim 1 wherein the contact pads are on the first surface of the wiring board.

4. The array of claim 1 wherein the at least one electrical lead extends laterally from the LED in a general direction approximately parallel to said third surface.

5. The array of claim 3 further comprising a thermally conductive and electrically insulating layer between the at least one electrical lead of at least some of the LEDs and the heatsink.

6. An electrical assembly comprising:
   an electronic device having a top, a bottom and electrical leads;
   a heatsink; and
   a wiring board with a through-hole for receiving the device such that the bottom of the device is in thermal contact with the heatsink, the top of the device protrudes through the wiring board, and the electrical leads of the device are positioned between and connected to a portion of the wiring board and the heatsink.

7. The assembly of claim 6 wherein the heatsink has a substantially planar upper surface and the wiring board is substantially parallel therewith.

8. The assembly of claim 6 further comprising a thermally conducting, electrically insulating resilient layer located between the electrical leads and the heatsink.

9. The assembly of claim 6 wherein the device is a surface mount semiconductor device and the elctrical leads protrude laterally therefrom between the top and bottom of the device.

10. The assembly of claim 9 wherein the electrical leads are attached to conducting regions on a lower surface of the wiring board facing toward the heatsink.

11. The assembly of claim 6 wherein the electrical leads are attached to conducting regions on an upper surface of the wiring board.

12. The assembly of claim 6 wherein the wiring board has a first portion closer to the heatsink on which are located contact regions to which the electrical leads attach and a second portion overlying the first region at least in part and wherein the electrical leads are captured between the first or second portion and the heatsink.

13. The assembly of claim 6 wherein the through hole in the wiring board has a first diameter through a first portion of the wiring board and a second diameter less than the first diameter through a second, superposed, portion of the wiring board.

14. The assembly of claim 13 wherein the first portion of the wiring board lies closer to the heatsink than the second portion.

15. The assembly of claim 13 wherein the device has a body region with an outer diameter less than the first diameter and greater than the second diameter.

16. A method for forming an electrical assembly, comprising:

providing a heatsink;

providing an electronic device having a top portion, base portion and electrical leads;

providing a wiring board with electrical contact regions and a hole extending between an upper surface and a lower surface of the wiring board;

installing the device on the wiring board such its top portion is exposed from the hole on the top surface, its bottom portion protrudes from the hole beyond the bottom surface and its electrical leads are attached to the electrical contact regions of the wiring board; and placing the lower surface of the wiring board in close proximity to the heat sink such that the bottom portion of the device is in thermal contact with the heat sink and the electrical leads of the device are positioned between and connected to a portion of the wiring board and the heat sink.

17. The method of claim 11 further comprising placing an electrically insulating thermally conducting layer between the wiring board and the heatsink.

18. The method of claim 11 further comprising clamping the wiring board to the heatsink.

* * * * *